United States Patent
Hsieh

(10) Patent No.: US 9,852,830 B2
(45) Date of Patent: Dec. 26, 2017

(54) APPARATUS AND METHODS FOR GENERATING A PRECISE RESISTOR

(71) Applicant: Realtek Semiconductor Corp., Hsinchu (TW)

(72) Inventor: Hong-Yean Hsieh, Santa Clara, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/662,337

(22) Filed: Mar. 19, 2015

(65) Prior Publication Data

US 2016/0276071 A1 Sep. 22, 2016

(51) Int. Cl.
| | |
|---|---|
| H03F 3/45 | (2006.01) |
| H03F 3/14 | (2006.01) |
| H01C 13/02 | (2006.01) |
| H03F 1/32 | (2006.01) |
| H01C 7/18 | (2006.01) |
| H01C 1/14 | (2006.01) |
| H03F 3/187 | (2006.01) |

(52) U.S. Cl.
CPC ............ *H01C 13/02* (2013.01); *H01C 1/14* (2013.01); *H01C 7/18* (2013.01); *H03F 1/3211* (2013.01); *H03F 3/187* (2013.01); *H03F 3/45475* (2013.01); *H03F 2200/03* (2013.01); *H03F 2203/45116* (2013.01); *H03F 2203/45136* (2013.01); *H03F 2203/45528* (2013.01)

(58) Field of Classification Search
CPC ....................................................... H01C 13/02
USPC .......................................... 330/260; 300/307
See application file for complete search history.

(56) References Cited

U.S. PATENT DOCUMENTS

| | | | |
|---|---|---|---|
| 5,977,571 A * | 11/1999 | Goossen | H01L 31/02005 257/184 |
| 6,906,593 B2 * | 6/2005 | Fotouhi | H03F 1/083 330/260 |
| 2003/0044027 A1 | 3/2003 | Tsuji et al. | |

OTHER PUBLICATIONS

CN Office Action dated Nov. 3, 2017 in Chinese application (No. 201610061399.3).

* cited by examiner

*Primary Examiner* — Khanh V Nguyen
*Assistant Examiner* — Khiem Nguyen
(74) *Attorney, Agent, or Firm* — McClure, Qualey & Rodack, LLP

(57) ABSTRACT

In one embodiment, an apparatus comprising a first resistor, the first resistor comprising a first type of resistor having a plurality of metal wires in respective layers, the plurality of metal wires arranged in series via a plurality of vias.

20 Claims, 8 Drawing Sheets

Metal resistor

Metal resistor

APPARATUS AND METHODS FOR GENERATING A PRECISE RESISTOR

BACKGROUND OF THE INVENTION

Field of the Invention

The present invention relates generally to the synthesis of a precise resistor, and more particularly to a monolithic resistor whose resistance is insensitive to the voltages across its two terminals.

Description of the Background Art

To produce a Hi-Fi sound in an audio application, the audio amplifier needs to produce a very low distortion signal. One major source of noise distortion is due to inherit resistance variations across the terminal voltages of a resistor. For a monolithic resistor, its resistance is sensitive to the values of the applied voltage across its two or more terminals. The resistance variations due to the applied voltage lead to significant distortions that can be detected by human ears.

A monolithic resistor is usually implemented by a poly-type resistor or a diffusion-type resistor. The material of a poly-type resistor is a polycrystalline silicon, which is a high purity, multi-crystalline form of silicon. A diffusion-type resistor is generally fabricated using one of the diffused or ion-implanted layers formed during the fabrication process or in some cases a combination of two layers. In CMOS, the diffused layer forming the source and drain of the MOS transistors can be used as a diffusion-type resistor. In silicon bipolar technology, the available diffused layers include base diffusion, emitter diffusion, active based region, and epitaxial layer. Unfortunately, these two types of resistors have large voltage-induced resistance variations no matter if they are lightly or heavily doped. The distortions caused cannot be ignored in Hi-Fi audio applications.

SUMMARY

The present invention pertains to the synthesis of a precise resistor. For instance, an apparatus and its implementation methods are disclosed that achieve low-variation monolithic resistors. The monolithic resistors are formed either by a series connection of several stacked metal wires or by a parallel connection of several stacked metal wires and any other type of material such as poly or diffusion. The implementation methods of the stacked metal wires are also disclosed in the invention.

In one embodiment, an inverting amplifier is configured to use the proposed resistors in its input and feedback resistors.

In one embodiment, a current-mode amplifier is configured to use the proposed resistor in its feedback resistor.

In one embodiment, a monolithic implementation of a resistor is disclosed in accordance with the present invention. The resistor is configured to comprise a series connection of several stacked metal wires.

In another embodiment, a monolithic implementation of a resistor is disclosed in accordance with the present invention. The resistor is configured to comprise a parallel connection of several stacked metal wires and another type of material, such as poly or diffusion.

These and other features of the present invention will be readily apparent to persons of ordinary skill in the art upon reading the entirety of this disclosure, which includes the accompanying drawings and claims.

DESCRIPTION OF THE DRAWINGS

Many aspects of the invention can be better understood with reference to the following drawings. The components in the drawings are not necessarily to scale, emphasis instead being placed upon clearly illustrating the principles of the present invention. The use of the same reference label in different drawings indicates the same or like components.

DETAILED DESCRIPTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
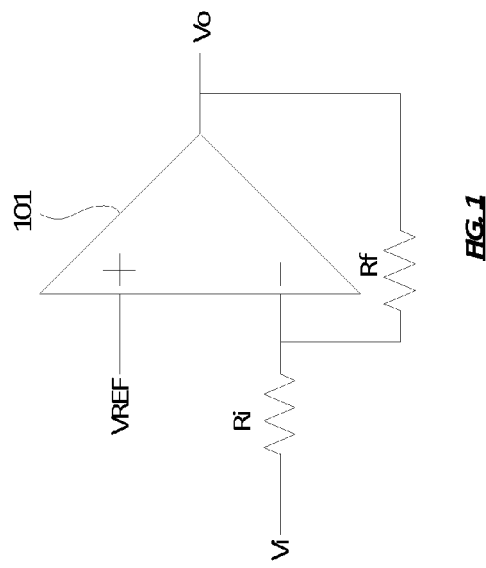
FIG. 1 shows an inverting amplifier comprising a pair of resistors in accordance with an embodiment of the present invention.

Embodiments of the present invention advantageously allow for fabrication of a monolithic resistor whose resistance is not sensitive to the voltage across its two terminals. FIG. 1 shows an inverting amplifier in accordance with an embodiment of the present invention. The inverting amplifier is configured to receive an input voltage Vi and a reference voltage VREF and to generate an output voltage Vo whose value is equal to (VREF−Vi)*Rf/Ri. The inverting amplifier comprises an operational amplifier 101, an input resistor Ri, and a feedback resistor Rf.

The output voltage Vo is proportional to the product of the input voltage and the ratio of Rf over Ri. If the resistance of the resistor varies with its applied voltage across its two terminals, the ratio of Rf over Ri is not constant as the applied voltage changes. Because of these variations, Vo is not linearly proportional to Vi.

Figure 2:
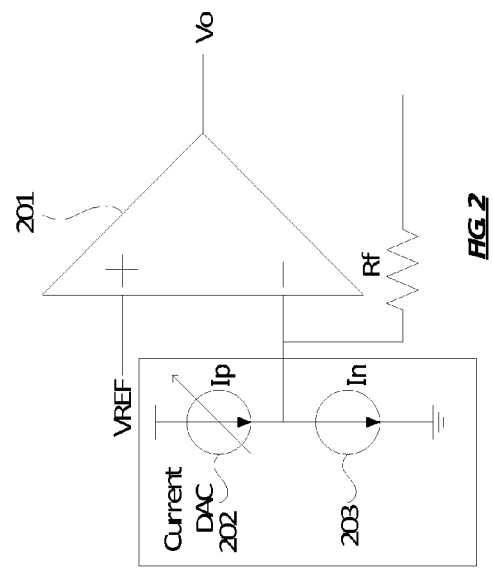
FIG. 2 shows a current-mode amplifier comprising a resistor in accordance with an embodiment of the present invention.

FIG. 2 shows a current-mode amplifier in accordance with an embodiment of the present invention. The current-mode amplifier is configured to receive two input currents Ip and In and a reference voltage VREF and to generate an output voltage Vo whose value is equal to VREF−(Ip−In)*Rf. The current-mode amplifier comprises an operational amplifier 201 and a feedback resistor Rf.

The output voltage Vo is proportional to the product of the difference of Ip and In and the resistance of the feedback resistor Rf. The resistance is generally not constant as the applied voltage across its two terminals changes. Because of the resistance variations, Vo is not linearly proportional to (Ip−In).

The resistance of a resistor across an applied voltage V12 across its two terminals n1 and n2 is usually modeled as $R0*(1.5-1/(2+rvc*V12^2))$ where R0 is the nominal resistance and rvc is the resistor's voltage coefficient. The resistor's voltage coefficient for each type (e.g., one or a combination involving metal, poly, diffusion) of resistor is different.

The resistor's voltage coefficient (rvc) of a monolithic resistor is usually modeled as $(rvc0+rvc1*w+rvc2*l/w)/l^2$ where w and l are the width and length of the monolithic resistor. The composite voltage coefficients rvc0, rvc1, and rvc2, each of which constitutes a portion of the resistor voltage coefficient, are different for each type of resistor too.

Figure 3:
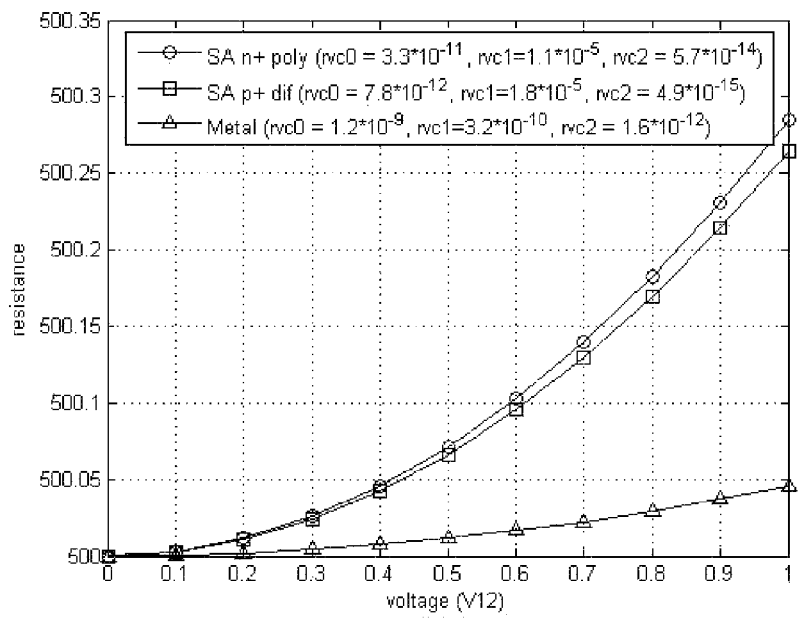
FIG. 3 compares the resistance variations across the applied two terminal voltages for different types of monolithic resistors.

FIG. 3 shows typical resistance variations for different types of resistors across their terminal voltages V12 where the nominal resistance R0 is equal to 500 Ohms. Three different types of resistors, n+ poly, p+ diffusion, and metal are compared in the figure. The composite voltage coefficients rvc0, rvc1, and rvc2 are also shown in the figure. The area sizes of three resistors are the same and six metal layers of a monolithic process are used in this example for the metal resistor. It can be easily seen from the figure that metal resistors have the lowest resistance variations as the terminal voltage V12 changes from 0 to 1 V.

Figure 4:
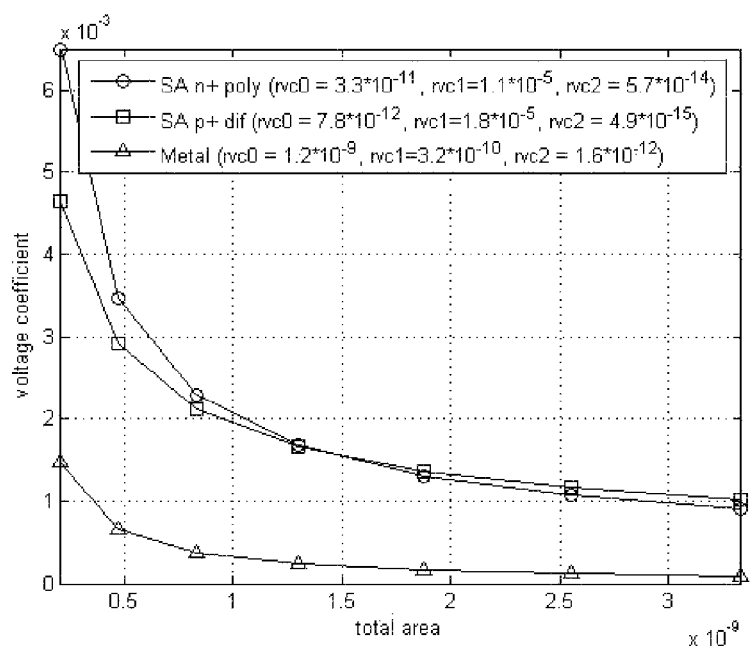
FIG. 4 compares resistors' voltage coefficients at different area size.

FIG. 4 compares resistors' voltage coefficient (rvc) for different types of resistors at different area sizes where the nominal resistance R0 is equal to 500 Ohm. The metal resistor uses six metal layers in this example. For a given area size (along a line parallel to y-axis), the metal resistor always shows the lowest resistor's voltage coefficient. The lower the value of a resistor's voltage coefficient (rvc), the smaller the distortion the resistor will produce. In other words, an amplifier using metal resistors has the best quality sound. For a given resistor's voltage coefficient value (along a line parallel to x-axis), the metal resistor always occupies the smallest area. In other words, metal is also the most area-efficient material to generate a resistance with a required resistor voltage coefficient.

Figure 5A:
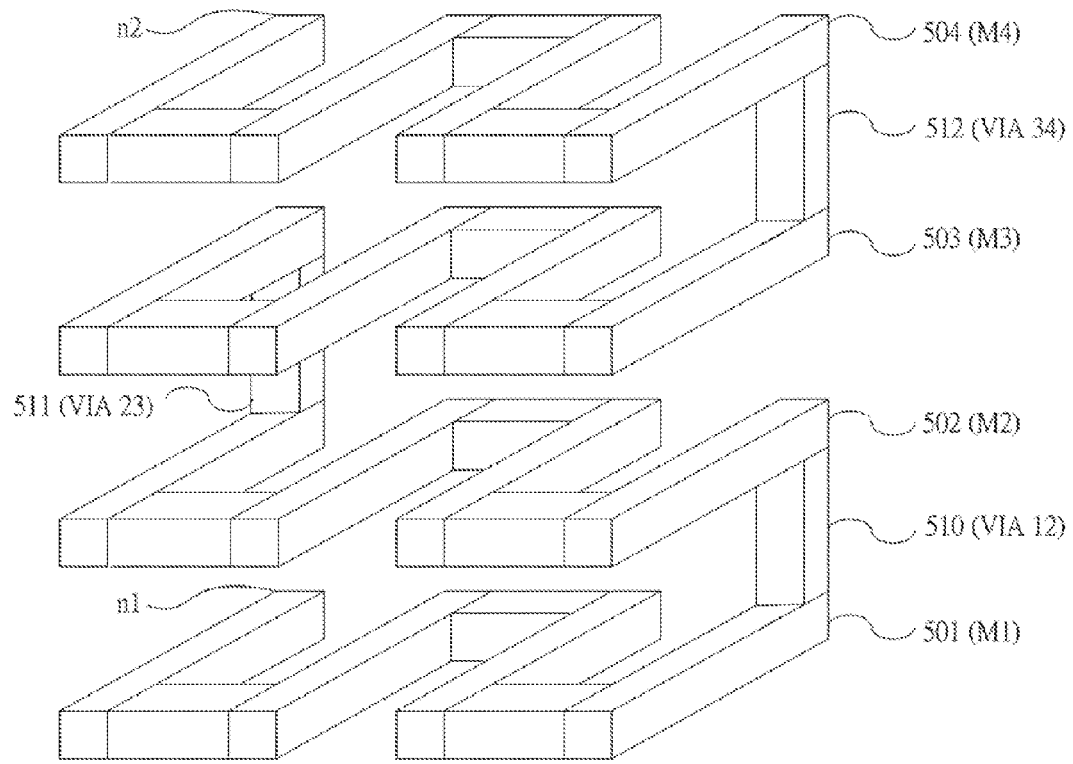
FIG. 5A shows a series connection of several stacked metal wires in accordance with an embodiment of the present invention.

FIG. 5A shows a metal resistor in accordance with an embodiment of the present invention. The metal resistor is configured to have a first terminal n1 and a second terminal n2. The metal resistor comprises four metal wires and three vias. The four metal wires are 501, 502, 503, and 504 where 501, 502, 503, and 504 are fabricated in metal layer 1, metal layer 2, metal layer 3, and metal layer 4, respectively. The three vias are 510 connecting 501 and 502, 511 connecting 502 and 503, and 512 connecting 503 and 504.

It is worth to note that each metal wire lies in a metal layer and no two metal wires lie in the same metal layer in the embodiment of the present invention. Assume that the minimum spacing is used in the layout of metal segments of a wire at the same layer. Compared to the embodiment shown in FIG. 6A, the effective parasitic capacitance of the embodiment shown in FIG. 5A is much smaller because the parasitic capacitance between two segments of a wire at the same layer is larger than the parasitic capacitance between two segments of two wires located at two metal layers. Also a minimum numbers of vias are used in the embodiment of the present invention that also helps to reduce distortions.

Figure 5B:
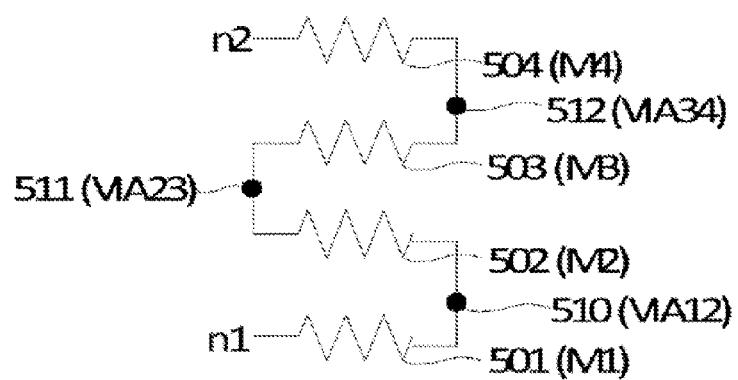
FIG. 5B symbolically shows a series connection of several stacked metal wires in accordance with an embodiment of the present invention.

FIG. 5B symbolically shows a series connection of stacked metal wires in accordance with an embodiment of the present invention. The metal resistor is configured to have a first terminal n1 and a second terminal n2. The metal resistor comprises four metal wires and three vias. The four metal wires are 501, 502, 503, and 504. The three vias are 510 connecting 501 and 502, 511 connecting 502 and 503, and 512 connecting 503 and 504.

Figure 6A:
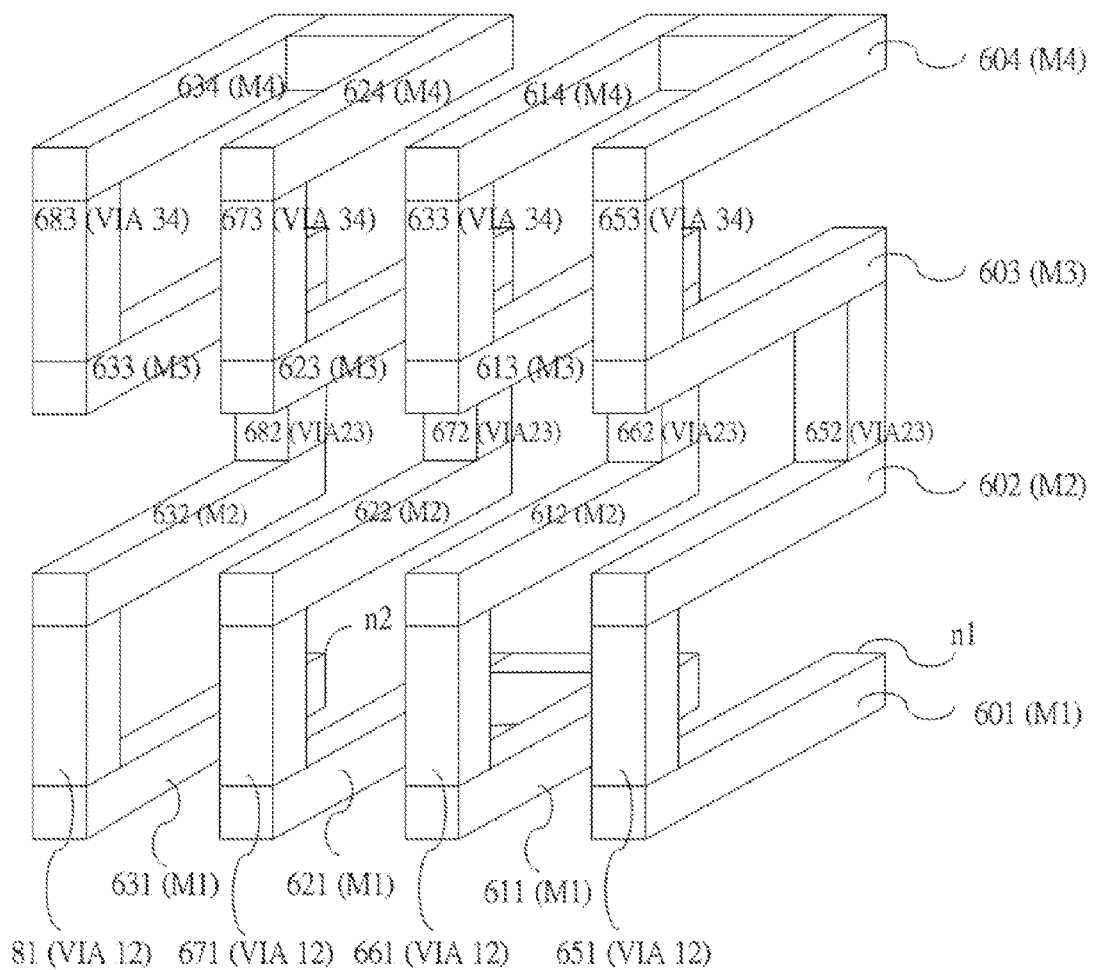
FIG. 6A shows another implementation of metal resistance in accordance with an embodiment of the present invention.

FIG. 6A shows another embodiment of a metal resistor. The metal resistor is configured to have a first terminal n1 and a second terminal n2. The metal resistor comprises sixteen metal wires and twelve vias. The sixteen metal wires are 601, 602, 603, 604, 611, 612, 613, 614, 621, 622, 623, 624, 631, 632, 633, and 634. 601, 611, 621, and 631 are fabricated in metal layer 1. 602, 612, 622, and 632 are fabricated in metal layer 2. 603, 613, 623, and 633 are fabricated in metal layer 3. 604, 614, 624, and 634 are fabricated in metal layer 4. The twelve vias are 651, 652, 653, 661, 662, 663, 671, 672, 673, 681, 682, and 683. Via 651, 661, 671, and 681 connect 601 and 602, 611 and 612, 621 and 622, and 631 and 632, respectively. Via 652, 662, 672, and 682 connect 602 and 603, 612 and 613, 622 and 623, and 632 and 633, respectively. Via 653, 663, 673, and 683 connect 603 and 604, 613 and 614, 623 and 624, and 633 and 634, respectively.

Figure 6B:
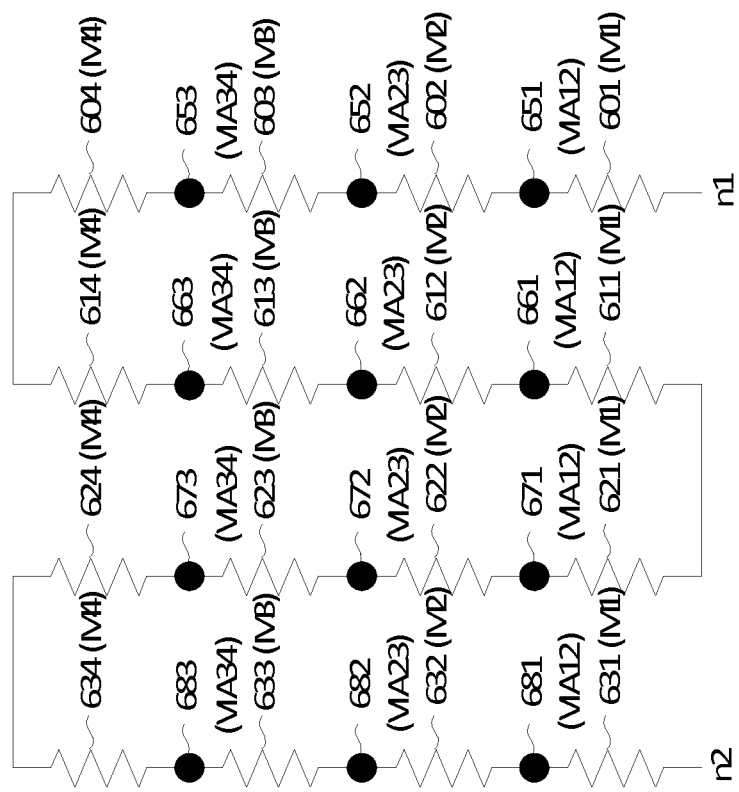
FIG. 6B symbolically shows a series connection of several stacked metal wires in accordance with an embodiment of the present invention.

FIG. 6B symbolically shows a series connection of stacked metal wires in FIG. 6A. The metal resistor comprises sixteen metal wires and twelve vias. The sixteen metal wires are 601, 602, 603, 604, 611, 612, 613, 614, 621, 622, 623, 624, 631, 632, 633, and 634. 601, 611, 621, and 631 are fabricated in metal layer 1. 602, 612, 622, and 632 are fabricated in metal layer 2. 603, 613, 623, and 633 are fabricated in metal layer 3. 604, 614, 624, and 634 are fabricated in metal layer 4. The twelve vias are 651, 652, 653, 661, 662, 663, 671, 672, 673, 681, 682, and 683. Via 651, 661, 671, and 681 connect 601 and 602, 611 and 612, 621 and 622, and 631 and 632, respectively. Via 652, 662, 672, and 682 connect 602 and 603, 612 and 613, 622 and 623, and 632 and 633, respectively. Via 653, 663, 673, and 683 connect 603 and 604, 613 and 614, 623 and 624, and 633 and 634, respectively.

Figure 7A:
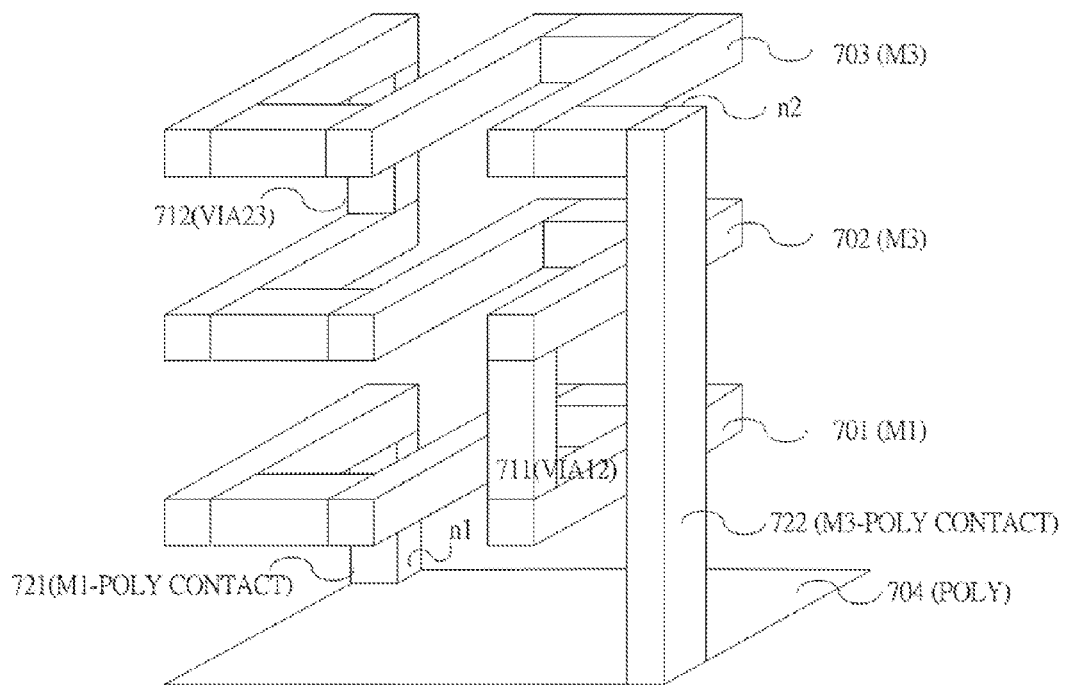
FIG. 7A shows a parallel connection of several stacked metal wires and a poly in accordance with an embodiment of the present invention.

FIG. 7A shows a parallel connection of stacked metal wires and a poly in accordance with an embodiment of the present invention. The synthesized resistor is configured to have a first terminal n1 and a second terminal n2. The stacked metal wires form a metal resistor that comprises three metal wires and two vias. The three metal wires are 701, 702, and 703 where 701, 702, and 703 are fabricated in metal layer 1, metal layer 2, and metal layer 3, respectively. The two vias are 711 connecting 701 and 702, and 712 connecting 702 and 703. The metal resistor is connected in parallel with a poly 704 with via 721 connecting 701 and 704, and via 722 connecting 703 and 704.

Figure 7B:
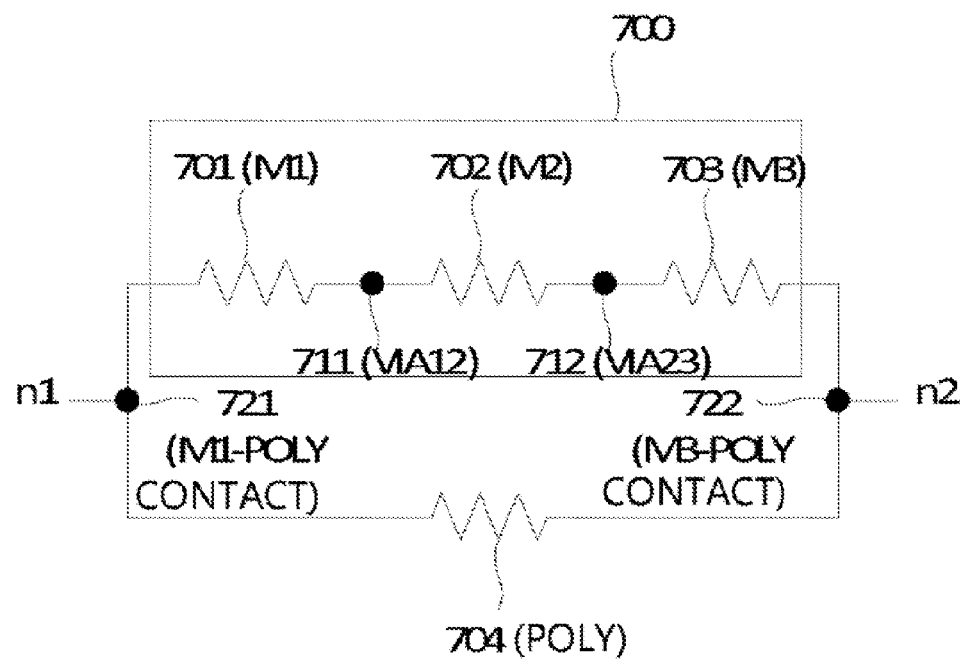
FIG. 7B symbolically shows a parallel connection of a metal resistor and a poly resistor in accordance with an embodiment of the present invention.

FIG. 7B symbolically shows a parallel connection of a metal resistor and a poly resistor in accordance with an embodiment of the present invention. The synthesized resistor is configured to have a first terminal n1 and a second terminal n2. The synthesized resistor comprises a metal resistor 700 and a poly resistor 704. The metal resistor 700 is connected in parallel with a poly resistor 704 with via 721 and 722. The metal resistor 700 is a series connection of three metal wires 701, 702, and 703 whereas metal wires 701, 702, and 703 lie in metal layer 1, 2, and 3, respectively, The metal wires 701 and 702 are connected by via 711. The metal wires 702 and 703 are connected by via 712.

Figure 8A:
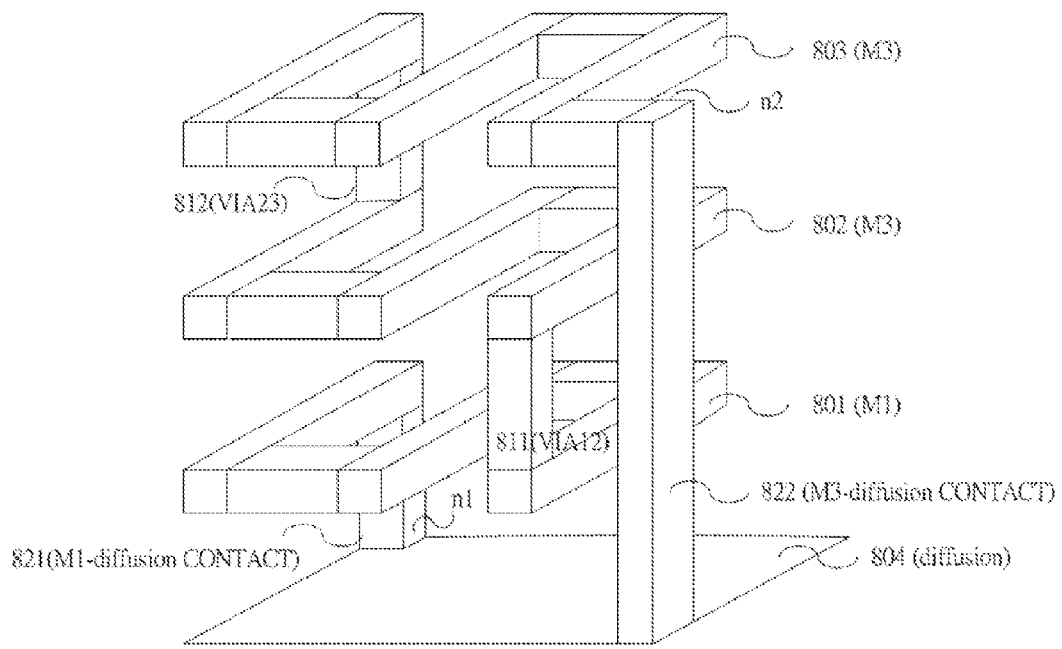
FIG. 8A shows a parallel connection of several stacked metal wires and a diffusion in accordance with an embodiment of the present invention.

FIG. 8A shows a parallel connection of stacked metal wires and a diffusion in accordance with an embodiment of the present invention. The synthesized resistor is configured to have a first terminal n1 and a second terminal n2. The stacked metal wires form a metal resistor that comprises three metal wires and two vias. The three metal wires are 801, 802, and 803 where 801, 802, and 803 are fabricated in metal layer 1, metal layer 2, and metal layer 3, respectively. The two vias are 811 connecting 801 and 802, and 812 connecting 802 and 803. The metal resistor is connected in parallel with a diffusion 804 with via 821 connecting 801 and 804, and via 822 connecting 803 and 804.

Figure 8B:
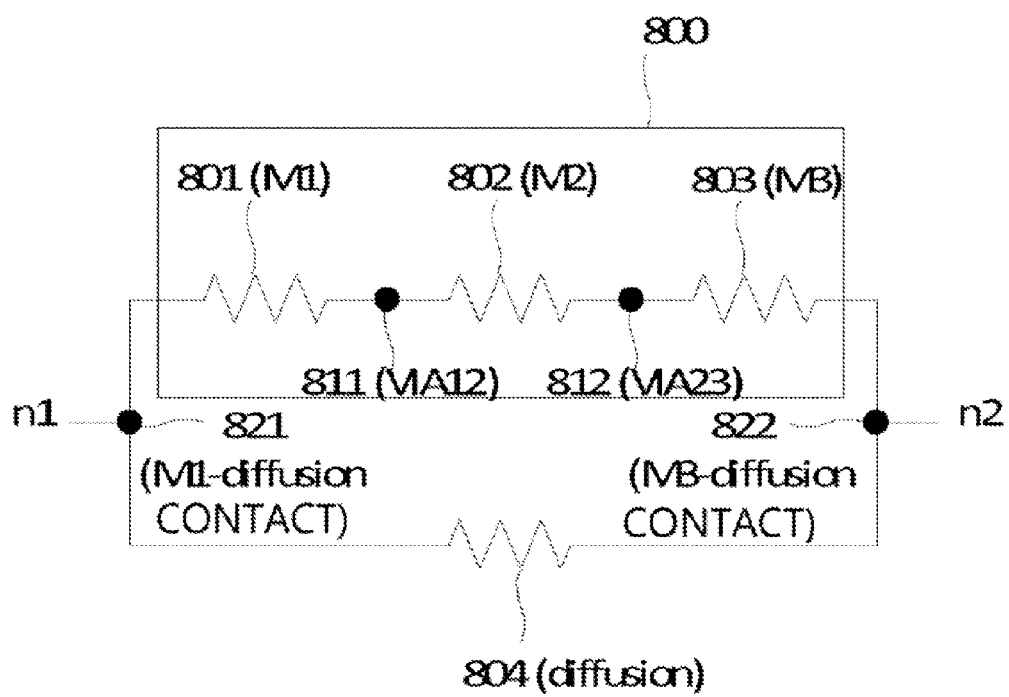
FIG. 8B symbolically shows a parallel connection of a metal resistor and a diffusion resistor in accordance with an embodiment of the present invention.

FIG. 8B symbolically shows a parallel connection of a metal resistor and a diffusion resistor in accordance with an embodiment of the present invention. The synthesized resistor is configured to have a first terminal n1 and a second terminal n2. The synthesized resistor comprises a metal resistor 800 and a diffusion resistor 804. The metal resistor 800 is connected in parallel with a diffusion resistor 804 with via 821 and 822. The metal resistor 800 is a series connection of three metal wires 801, 802, and 803 whereas the metal wires 801, 802, and 803 lie in metal layer 1, 2, and 3, respectively, The metal wires 801 and 802 are connected by via 811. The metal wires 802 and 803 are connected by via 812.

Figure 9A:
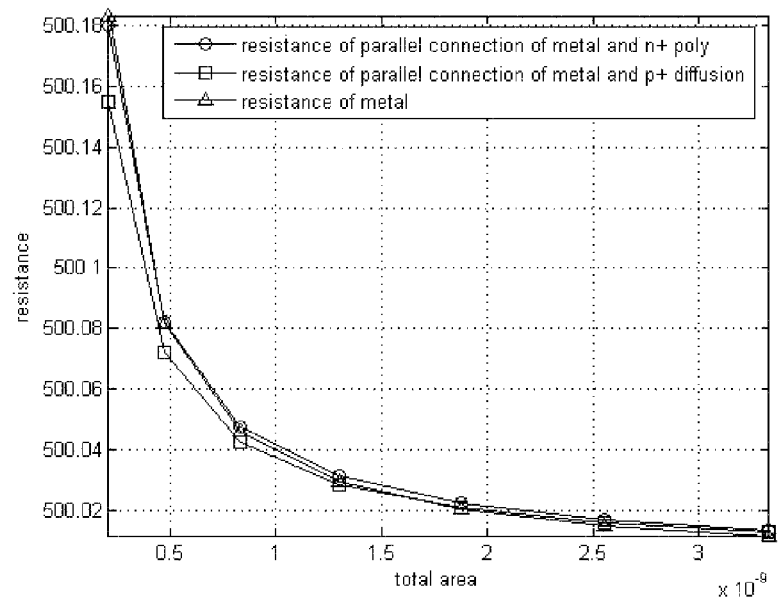
FIG. 9A compares the resistance variations across the applied two terminal voltages at 1V for different types of resistors at different area size in accordance with an embodiment of the present invention.

FIG. 9A shows resistance variations for different type of resistors across their terminal voltages (=1V) at different area sizes where the nominal resistance R0 is equal to 500 Ohms. Three different types of resistors, a parallel connection of an n-F poly resistor and a metal resistor, a parallel connection of a p+ diffusion resistor and a metal resistor, and a metal resistor are compared in the figure. These three types of resistors use the same metal resistor that uses six metal layers of a monolithic process. It can be easily seen from the figure that the parallel connection of a p+ diffusion resistor and a metal resistor always has the lowest resistance variations among all three types of resistors. In contrast, the metal resistor alone always has the largest resistance variations.

Figure 9B:
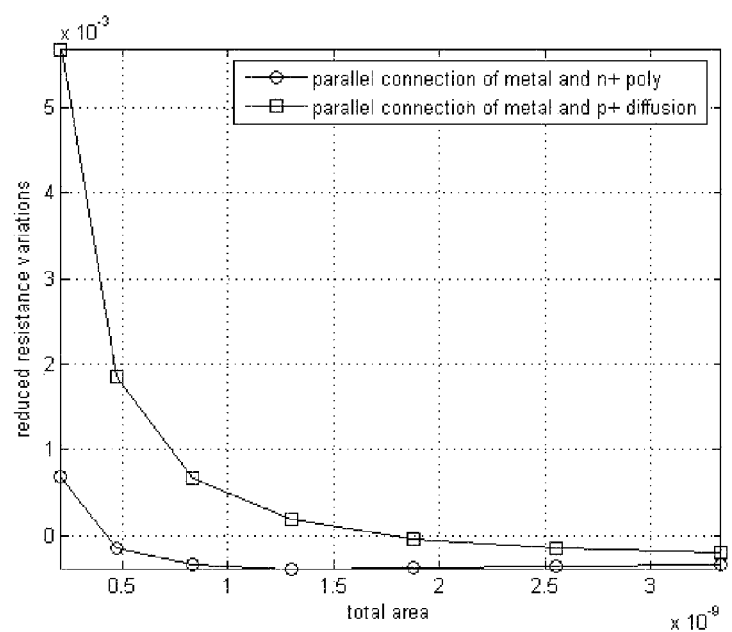
FIG. 9B show the reduced resistance variations across the applied two terminal voltages at 1V for different types of resistors at different area size in accordance with an embodiment of the present inventions.

FIG. 9B shows the reduced resistance variations between a parallel connection of an n+ poly resistor and a metal resistor, and a parallel connection of a p+ diffusion resistor and a metal resistor. The reduced resistance variations are compared against a metal resistor with the same area cost. It can be also seen from the figure that the parallel connection of a p+ diffusion resistor and a metal resistor is better than the parallel connection of an n+ poly resistor and a metal resistor in this embodiment.

An apparatus and a method for generating a precise resistor have been disclosed. It should be appreciated by one having ordinary skill in the art that the embodiments disclosed in FIGS. 1-2 and 5-8 are understood as monolithic components of an integrated circuit, the integrated circuit comprising a small scale (e.g., in square millimeters) semiconductor plate or chip with a plurality of circuits integrated therein as understood in industry. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An apparatus, comprising:
an operational amplifier; and
a first resistor coupled to the operational amplifier, the first resistor comprising a first type of resistor having a plurality of metal wires in respective layers;
wherein the plurality of metal wires in a first layer include at least a first segment, a second segment and a third segment; the first segment and the third segment are placed in parallel; the second segment is coupled between the first segment and the third segment; and the direction of the second segment is perpendicular to the direction of the first segment and the third segment; and
wherein the plurality of metal wires in a second layer include at least a fourth segment; the fourth segment is placed underneath the first segment and coupled with the first segment by a via; the via and the second segment are respectively coupled at two terminals of the first segment; and the direction of the fourth segment and the direction of the first segment are the same.

2. The apparatus of claim 1, wherein the first resistor further comprises a second type of resistor arranged in parallel with the first type of resistor.

3. The apparatus of claim 2, wherein the second type of resistor comprises a poly-type resistor.

4. The apparatus of claim 2, wherein the second type of resistor comprises a diffusion-type resistor.

5. The apparatus of claim 1, wherein the operational amplifier comprises an inverting terminal to receive a current difference, a non-inverting terminal to receive a reference voltage, and an output terminal, the first resistor connecting the output terminal to the inverting terminal in a feedback arrangement.

6. The apparatus of claim 5, wherein the first resistor further comprises a second type of resistor arranged in parallel to the first type of resistor.

7. The apparatus of claim 6, wherein the second type of resistor comprises one of a poly-type resistor or a diffusion-type resistor.

8. The apparatus of claim 1, wherein the operational amplifier comprises an inverting terminal, a second resistor coupled between an input voltage and the inverting terminal, a non-inverting terminal to receive a reference voltage, and an output terminal, the first resistor connecting the output terminal to the inverting terminal in a feedback arrangement, the second resistor comprising the first type of resistor.

9. The apparatus of claim 8, wherein the first resistor comprises a second type of resistor arranged in parallel to the first type of resistor of the first resistor, the second type of resistor of the first resistor comprising one of a poly-type resistor or a diffusion-type resistor.

10. The apparatus of claim 9, wherein the second resistor comprises the second type of resistor arranged in parallel to the first type of resistor of the second resistor, the second type of resistor of the second resistor comprising one of the poly-type resistor or the diffusion-type resistor.

11. The apparatus of claim 8, wherein the second resistor comprises a second type of resistor arranged in parallel to the first type of resistor of the second resistor, the second type of resistor of the second resistor comprising one of a poly-type resistor or a diffusion-type resistor.

12. An apparatus, comprising:
an operational amplifier; and
a first resistor coupled to the operational amplifier, the first resistor comprising a first type of resistor having a plurality of metal wires in respective layers;
wherein the plurality of metal wires in a first layer include at least a first segment, a second segment and a third segment; the first segment, the second segment and the third segment are routed in a U shape configuration from a top view; and
wherein the plurality of metal wires in second layer include at least a fourth segment coupled with the first segment through a via; the first segment, the via and the fourth segment are routed in a U shape configuration from a side view.

13. The apparatus of claim 12, wherein the first resistor further comprises a second type of resistor arranged in parallel with the first type of resistor.

14. The apparatus of claim 13, wherein the second type of resistor comprises a poly-type resistor.

15. The apparatus of claim 13, wherein the second type of resistor comprises a diffusion-type resistor.

16. The apparatus of claim 12, wherein the operational amplifier comprises an inverting terminal to receive a current difference, a non-inverting terminal to receive a reference voltage, and an output terminal, the first resistor connecting the output terminal to the inverting terminal in a feedback arrangement.

17. The apparatus of claim 16, wherein the first resistor further comprises a second type of resistor arranged in parallel to the first type of resistor.

18. The apparatus of claim 17, wherein the second type of resistor comprises one of a poly-type resistor or a diffusion-type resistor.

19. The apparatus of claim 12, wherein the operational amplifier comprises an inverting terminal, a second resistor coupled between an input voltage and the inverting terminal, a non-inverting terminal to receive a reference voltage, and an output terminal, the first resistor connecting the output terminal to the inverting terminal in a feedback arrangement, the second resistor comprising the first type of resistor.

20. The apparatus of claim 19, wherein the first resistor comprises a second type of resistor arranged in parallel to the first type of resistor of the first resistor, the second type of resistor of the first resistor comprising one of a poly-type resistor or a diffusion-type resistor.

* * * * *